(12) United States Patent
Murakami

(10) Patent No.: US 9,136,392 B2
(45) Date of Patent: Sep. 15, 2015

(54) SEMICONDUCTOR MEMORY DEVICE AND METHOD FOR MANUFACTURING THE SAME

(71) Applicant: KABUSHIKI KAISHA TOSHIBA, Minato-ku (JP)

(72) Inventor: Sadatoshi Murakami, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 4 days.

(21) Appl. No.: 13/971,220

(22) Filed: Aug. 20, 2013

(65) Prior Publication Data

US 2014/0061754 A1 Mar. 6, 2014

(30) Foreign Application Priority Data

Aug. 28, 2012 (JP) ................. 2012-187625

(51) Int. Cl.
*H01L 27/115* (2006.01)
*H01L 29/788* (2006.01)
*H01L 29/66* (2006.01)
*H01L 29/792* (2006.01)

(52) U.S. Cl.
CPC ........ *H01L 29/788* (2013.01); *H01L 27/11521* (2013.01); *H01L 27/11551* (2013.01); *H01L 27/11556* (2013.01); *H01L 27/11582* (2013.01); *H01L 29/66825* (2013.01); *H01L 29/66833* (2013.01); *H01L 29/7926* (2013.01)

(58) Field of Classification Search
CPC .............. H01L 27/11521; H01L 27/11551; H01L 25/11556; H01L 29/7926
See application file for complete search history.

(56) References Cited

U.S. PATENT DOCUMENTS

| | | |
|---|---|---|
| 2001/0003053 A1 | 6/2001 | Nagasaka |
| 2009/0057830 A1 | 3/2009 | Ebihara |
| 2010/0207195 A1 | 8/2010 | Fukuzumi et al. |
| 2013/0126961 A1 | 5/2013 | Fukuzumi et al. |

FOREIGN PATENT DOCUMENTS

| | | |
|---|---|---|
| JP | 11-54697 | 2/1999 |
| JP | 2001-313375 | 11/2001 |
| JP | 2004-40009 | 2/2004 |
| JP | 2007-250652 | 9/2007 |
| JP | 2009-54841 | 3/2009 |

*Primary Examiner* — Amar Movva
(74) *Attorney, Agent, or Firm* — Oblon, McClelland, Maier & Neustadt, L.L.P.

(57) ABSTRACT

According to one embodiment, the underlying film includes a memory region including a first trench and a peripheral region including a second trench. The stacked body includes conductive layers and insulating layers alternately stacked on the underlying film. The channel body is provided in a pair of first holes and the first trench. The first holes pierce the stacked body to be connected to the first trench. The memory film includes a charge storage film provided between a side wall of the first hole and the channel body, and between an inner wall of the first trench and the channel body. The conductor is provided in a pair of second holes and the second trench. The second holes pierce the stacked body to be connected to the second trench.

16 Claims, 16 Drawing Sheets

SEMICONDUCTOR MEMORY DEVICE AND METHOD FOR MANUFACTURING THE SAME

CROSS-REFERENCE TO RELATED APPLICATIONS

This application is based upon and claims the benefit of priority from Japanese Patent Application No. 2012-187625, filed on Aug. 28, 2012; the entire contents of which are incorporated herein by reference.

FIELD

Embodiments described herein relate generally to a semiconductor memory device and a method for manufacturing the same.

BACKGROUND

A structure is known in which, in a chip including a memory cell transistor of a stack gate structure in which a floating gate and a control gate are stacked, a resistance element of a peripheral circuit is formed using polysilicon of the floating gate.

In addition, a memory device of a three-dimensional structure is proposed in which a memory hole is formed in a stacked body in which an electrode film functioning as the control gate of a memory cell and an inter-electrode insulating film are alternately stacked in plural, and a silicon body serving as a channel is provided on the side wall of the memory hole via a charge storage film. In such a memory device of a three-dimensional structure, it is required also for the resistance element to have a different structure from a memory device of a two-dimensional structure.

DETAILED DESCRIPTION

Figure 1:
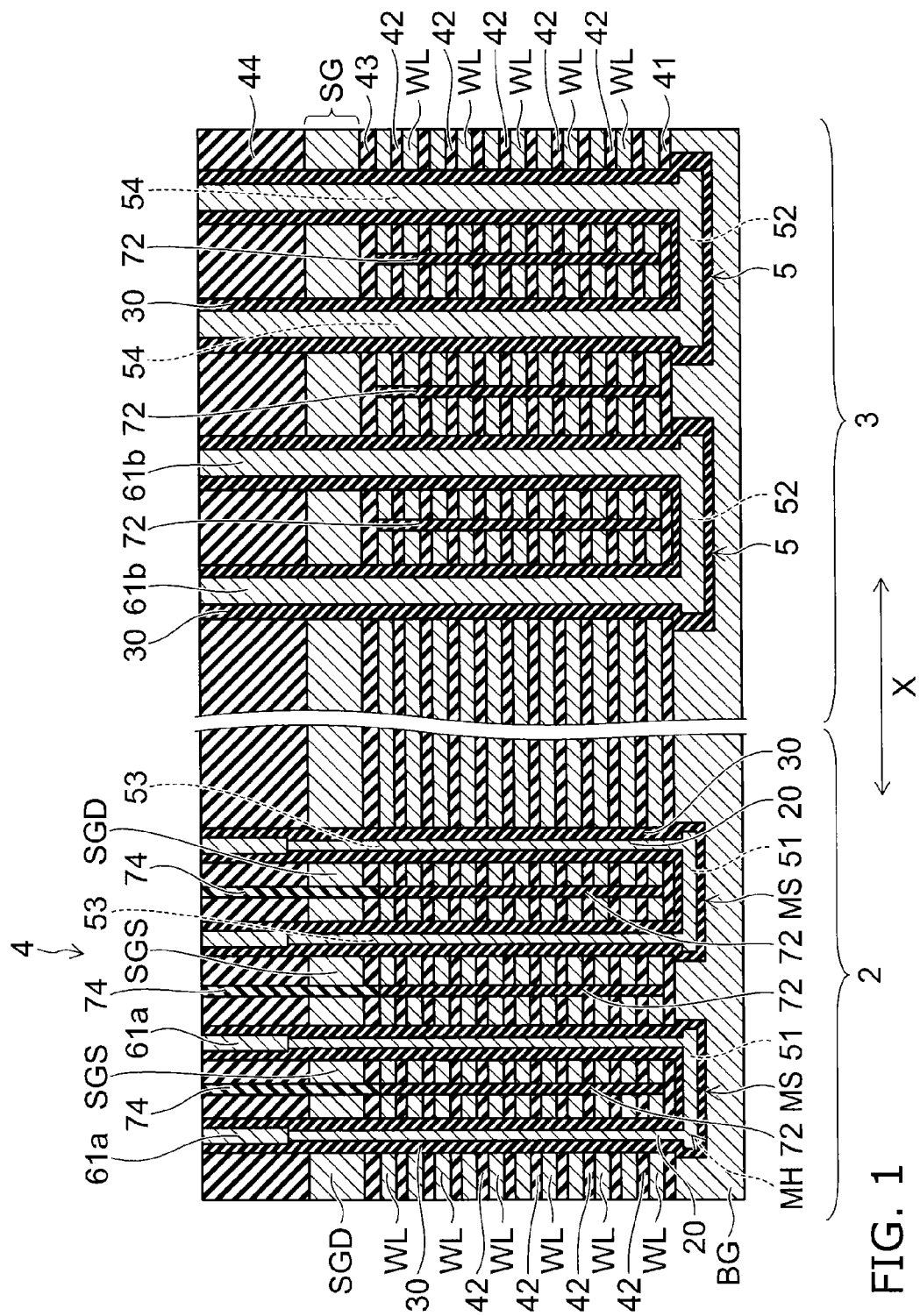
FIG. 1 is a schematic cross-sectional view of a semiconductor memory device of a first embodiment.

According to one embodiment, a semiconductor memory device includes an underlying film, a stacked body, a channel body, a memory film and a conductor. The underlying film includes a memory region and a peripheral region. The memory region includes a first trench, and the peripheral region includes a second trench. The stacked body includes a plurality of conductive layers and a plurality of insulating layers alternately stacked on the underlying film. The channel body is provided in a pair of first holes and in the first trench. The pair of first holes pierces the stacked body on the memory region to be connected to the first trench. The memory film includes a charge storage film provided between a side wall of the first hole and the channel body, and between an inner wall of the first trench and the channel body. The conductor is provided in a pair of second holes and in the second trench. The pair of second holes pierces the stacked body on the peripheral region to be connected to the second trench and has a hole diameter larger than a hole diameter of the first hole.

Various embodiments will be described hereinafter with reference to the accompanying drawings. In the drawings, identical components are marked with the same reference numerals.

First Embodiment

FIG. 1 is a schematic cross-sectional view of a semiconductor memory device of a first embodiment.

The semiconductor memory device of the embodiment includes a stacked body in which a conductive layer WL and an insulating layer 42 are alternately stacked in plural. The stacked body is provided on a back gate BG as an underlying film. The back gate BG is a conductive film, and is, for example, a silicon film doped with an impurity.

Figure 5A:
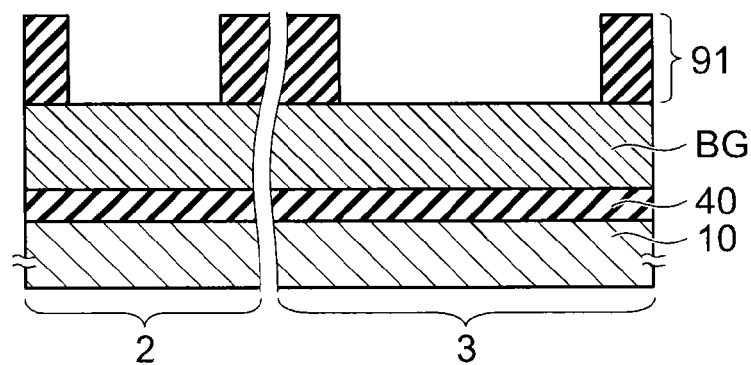
FIG. 5A to FIG. 13 are schematic cross-sectional views showing a method for manufacturing the semiconductor memory device of the first embodiment.
Figure 5B:
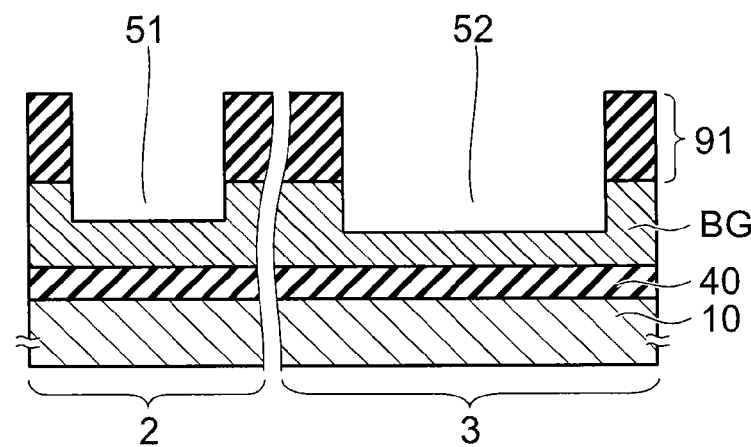
Figure 5C:
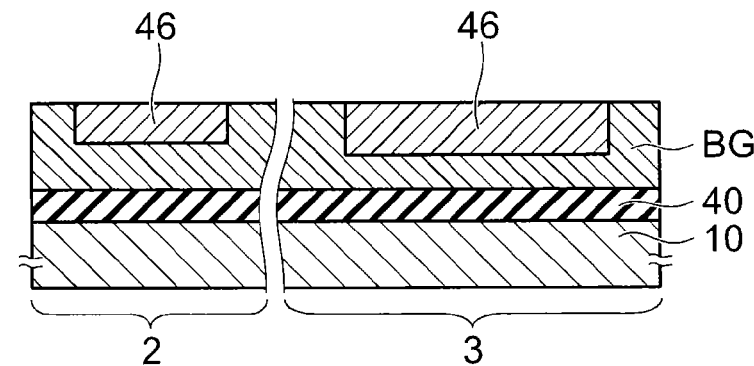

Although the illustration is omitted in FIG. 1, the back gate BG is provided on a substrate 10 shown in FIGS. 5A to 5C via an insulating layer 40.

In a planar view, the back gate BG is roughly divided into a memory region 2 and a peripheral region 3 around the memory region 2.

A memory cell array 4 is provided in the memory region 2.

Figure 2:
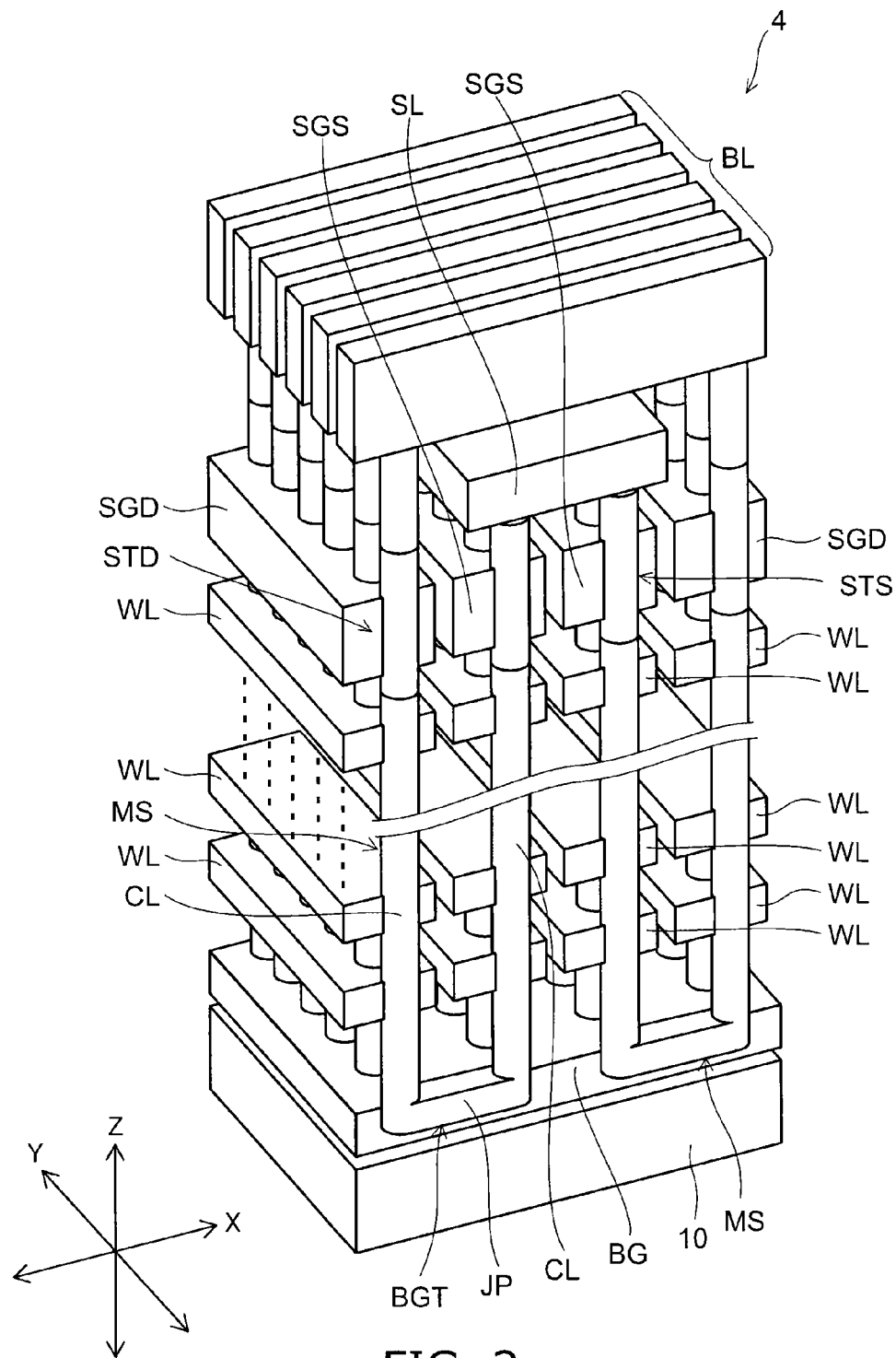
FIG. 2 is a schematic perspective view of a memory array cell in the semiconductor memory device of the embodiment.

FIG. 2 is a schematic perspective view of the memory cell array 4. In FIG. 2, the illustration of the insulating portions is omitted for easier viewing of the drawing.

In FIG. 2, an XYZ orthogonal coordinate system is introduced. Two directions parallel to the major surface of the substrate 10 and orthogonal to each other are defined as the X direction (a first direction) and the Y direction (a second direction), and the direction orthogonal to both of the X direction and the Y direction is defined as the Z direction (the stacking direction of the stacked body or a third direction). The cross section of the memory cell array 4 shown in FIG. 1 shows a cross section parallel to the XZ plane in FIG. 2.

The memory cell array 4 includes a plurality of memory strings MS. One memory string MS is formed in a U-shaped configuration including a pair of columnar portions CL extending in the Z direction and a joining portion JP joining the lower ends of the pair of columnar portions CL.

Figure 3:
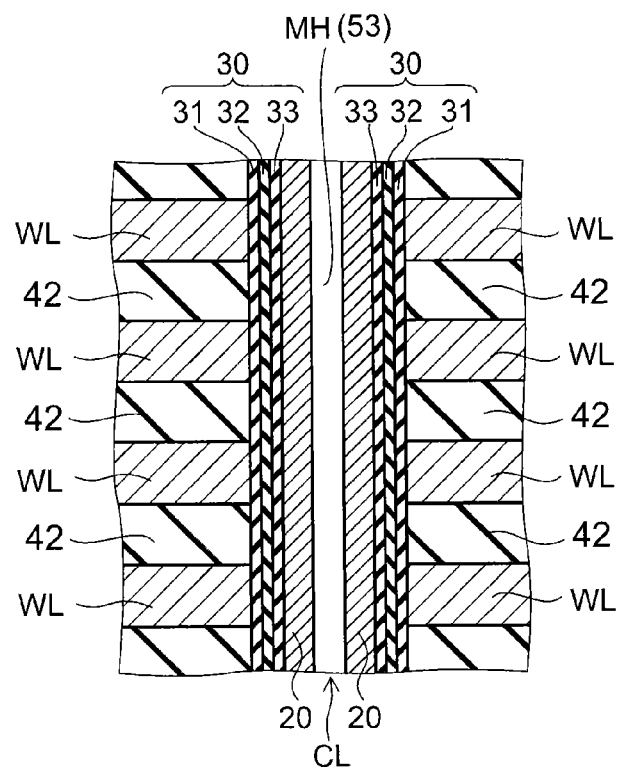
FIG. 3 is a schematic cross-sectional view of a part of the memory cell array in FIG. 2.

FIG. 3 shows an enlarged cross-sectional view of the columnar portion CL of the memory string MS.

An insulating layer 41 is provided on the back gate BG as shown in FIG. 1. The conductive layer WL and the insulating layer 42 are alternately stacked in plural on the insulating layer 41. The number of conductive layers WL shown in FIG. 1 is an example, and the number of conductive layers WL is arbitrary.

The conductive layer WL is a polysilicon film doped with, for example, boron as an impurity (a first silicon film), and has an electrical conductivity sufficient to function as the gate electrode of a memory cell.

The insulating layers 41 and 42 are, for example, a film mainly containing silicon oxide. Alternatively, a film mainly containing silicon nitride may be used as the insulating layers 41 and 42.

A drain-side select gate SGD is provided in the upper end portion of one of the pair of columnar portions CL of the U-shaped memory string MS, and a source-side select gate SGS is provided in the upper end portion of the other of the pair of columnar portions CL. The drain-side select gate SGD and the source-side select gate SGS are provided on the uppermost conductive layer WL via an insulating layer 43.

The drain-side select gate SGD and the source-side select gate SGS are a polysilicon film doped with, for example, boron as an impurity, and have an electrical conductivity sufficient to function as the gate electrode of a select transistor. The thickness of the drain-side select gate SGD and the thickness of the source-side select gate SGS are thicker than the thickness of each of the conductive layers WL.

The drain-side select gate SGD and the source-side select gate SGS are divided in the X direction by an insulating film 74 shown in FIG. 1. The conductive layer WL stacked under the drain-side select gate SGD and the conductive layer WL stacked under the source-side select gate SGS are divided in the X direction by an insulating film 72. Also the stacked body between memory strings MS adjacent in the X direction is divided in the X direction by the insulating film 72.

A source line SL shown in FIG. 2 is provided on the source-side select gate SGS via an insulating layer 44 shown in FIG. 1. The source line SL is, for example, a metal film. Bit lines BL that are a plurality of metal interconnections are provided on the drain-side select gate SGD and the source line SL via the insulating layer 44. Each bit line BL extends in the X direction.

The memory string MS includes a channel body 20 provided in a U-shaped memory hole MH (shown in FIG. 9) formed in the stacked body including the back gate BG, the plurality of conductive layers WL, the insulating layers 41 to 44, the drain-side select gate SGD, and the source-side select gate SGS.

The channel body 20 is provided in the U-shaped memory hole MH via a memory film 30. As shown in FIG. 3, the memory film 30 is provided between the side wall of the memory hole MH (a first hole 53) and the channel body 20.

The channel body 20 is, for example, a non-doped silicon film. Here, "non-doped" means that an impurity for providing electrical conductivity is not intentionally added to the silicon film and impurities are not substantially contained other than the elements resulting from the source gas in the film-formation.

Although FIG. 3 illustrates a structure in which the channel body 20 is provided such that a hollow portion remains on the central axis side of the memory hole MH (the first hole 53), the entire space in the memory hole MH (the first hole 53) may be filled up with the channel body 20, or a structure in which an insulator is buried in the hollow portion on the inside of the channel body 20 is possible.

The memory film 30 includes a block film 31, a charge storage film 32, and a tunnel film 33. The block film 31, the charge storage film 32, and the tunnel film 33 are provided in this order from the conductive layer WL side between each conductive layer WL and the channel body 20. The block film 31 is in contact with each conductive layer WL, the tunnel film 33 is in contact with the channel body 20, and the charge storage film 32 is provided between the block film 31 and the tunnel film 33.

The channel body 20 functions as a channel in a memory cell, the conductive layer WL functions as the control gate of the memory cell, and the charge storage film 32 functions as a data memory layer that stores a charge injected from the channel body 20. That is, a memory cell with a structure in which the control gate surrounds the periphery of the channel is formed at the intersection between the channel body 20 and each conductive layer WL.

The semiconductor memory device of the embodiment is a nonvolatile semiconductor memory device that can perform the erasing and writing of data electrically in a free manner and can retain the memory content even when the power is turned off.

The memory cell is, for example, a charge trap memory cell. The charge storage film 32 includes a large number of trap sites that trap a charge, and is a silicon nitride film, for example.

The tunnel film 33 is, for example, a silicon oxide film, and forms a potential barrier when a charge is injected from the channel body 20 into the charge storage film 32 or when the charge stored in the charge storage film 32 is diffused to the channel body 20.

The block film 31 is, for example, a silicon oxide film, and prevents the charge stored in the charge storage film 32 from diffusing to the conductive layer WL.

The drain-side select gate SGD, the channel body 20, and the memory film 30 between them constitute a drain-side select transistor STD (shown in FIG. 2). Above the drain-side select gate SGD, the channel body 20 is connected to the bit line BL via a conductor 61a. The conductor 61a is, for example, a silicon film doped with phosphorus (P).

The source-side select gate SGS, the channel body 20, and the memory film 30 between them constitute a source-side select transistor STS (shown in FIG. 2). Above the source-side select gate SGS, the channel body 20 is connected to the source line SL via the conductor 61a.

The back gate BG, and the channel body 20 and the memory film 30 provided in the back gate BG constitute a back gate transistor BGT (shown in FIG. 2).

The memory cell using each conductive layer WL as the control gate is provided in plural between the drain-side select transistor STD and the back gate transistor BGT. Similarly, the memory cell using each conductive layer WL as the control gate is provided in plural also between the back gate transistor BGT and the source-side select transistor STS.

The plurality of memory cells, the drain-side select transistor STD, the back gate transistor BGT, and the source-side select transistor STS are connected in series via the channel body 20, and constitute one U-shaped memory string MS. The memory string MS is arranged in plural in the X direction and the Y direction; thus, a plurality of memory cells are provided three-dimensionally in the X direction, the Y direction, and the Z direction.

Next, the peripheral region 3 is described.

The stacked body described above on the back gate BG is provided not only in the memory region 2 but also in the peripheral region 3 as shown in FIG. 1. That is, the insulating layer 42 and the conductive layer WL are alternately stacked in plural also on the back gate BG in the peripheral region 3.

As described later, when the channel body 20 is formed in the memory region 2, the channel body 20 is formed also in a U-shaped hole in the peripheral region 3. After that, in the peripheral region 3, etchback is performed to remove the channel body 20. Alternatively, the channel body 20 may be left in the U-shaped hole in the peripheral region 3.

In the peripheral region 3, a select gate SG is provided on the uppermost conductive layer WL via the insulating layer 43. The select gate SG is formed simultaneously with the drain-side select gate SGD and the source-side select gate SGS in the memory cell array 4 using the same material.

A resistance element 5 is provided in the peripheral region 3. The resistance element 5 is formed in a U-shaped configuration similarly to the memory string MS.

Figure 4:
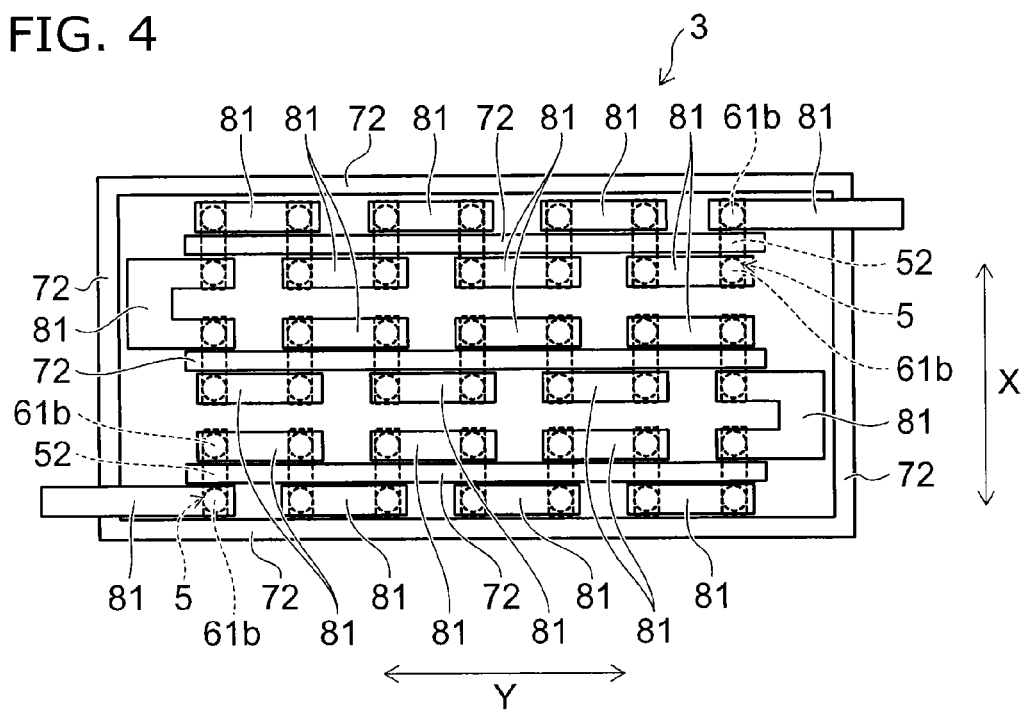
FIG. 4 is a schematic plan view of a resistance element in the semiconductor memory device of the embodiment.

FIG. 4 is a schematic plan view of a region of the peripheral region 3 where the resistance element 5 is provided.

As shown in FIG. 1, the resistance element 5 includes a conductor 61b functioning as a resistor. The conductor 61b is buried in the U-shaped hole via an insulating film 30, and is formed in a U-shaped configuration. The conductor 61b is, for example, a silicon film doped with phosphorus (P), and has a lower resistance than the channel body 20, which is a non-doped silicon film, in the memory string MS. Therefore, the controllability of the resistance value is good.

One U-shaped hole in which the conductor 61b is buried includes a pair of second holes 54 (shown in FIG. 9) extending in the stacking direction of the stacked body and a second trench 52 (shown in FIG. 9) formed in the back gate BG and connected to the lower ends of the pair of second holes 54. The U-shaped hole used for the resistance element 5 is formed simultaneously with the U-shaped memory hole MH used for the memory string MS in the same process.

However, the hole diameter of the second hole 54 used for the resistance element 5 is larger than the hole diameter of the first hole 53 used for the memory string MS. The volume of the second trench 52 used for the resistance element 5 formed in the back gate BG in the peripheral region 3 is larger than the volume of a first trench 51 used for the memory string MS formed in the back gate BG in the memory region 2.

Thereby, as described later, the conductor (resistor) 61b, not the channel body 20, can be buried in the U-shaped hole used for the resistance element 5, while the memory string MS and the resistance element 5 are formed simultaneously.

Narrowing the pitch (the pitch in the X direction and the pitch in the Y direction) between memory strings MS provided in the memory region 2 leads to an increase in the memory capacity per unit area. On the other hand, since the resistance element 5 does not function as a memory element, the pitch (the pitch in the X direction and the pitch in the Y direction) between resistance elements 5 can be made wider than the pitch between memory strings MS.

During the formation of the memory film 30 in the memory hole MH, the memory film 30 is formed also on the inner wall of the U-shaped hole in the peripheral region 3. Therefore, the same configuration as the memory film 30 or an insulating film including part of the memory film 30 is provided between the side wall of the second hole 54 and the conductor 61b and between the inner wall of the second trench 52 and the conductor 61b.

Also the stacked body on the peripheral region 3 is divided by the insulating film 72 similarly to the stacked body on the memory region 2. Thus, the plurality of conductive layers WL between a pair of columnar portions extending in the stacking direction of the U-shaped conductor 61b are divided in the X direction by the insulating film 72. Also the plurality of conductive layers WL between adjacent resistance elements 5 are divided in the X direction by the insulating film 72.

As shown in FIG. 4, also in the stacked body around the region where a plurality of resistance elements 5 are provided, the insulating film 72 is provided so as to surround the region. By the insulating film 72, the region where the resistance elements 5 are provided is separated on the substrate 10 from other regions such as the memory region 2.

The upper end of the conductor 61b of each resistance element 5 is connected to a resistance interconnection 81 shown in FIG. 4 via a not-shown contact. The plurality of resistance elements 5 are connected in series by the resistance interconnection 81, for example. The resistance interconnection 81 is provided on the stacked body shown in FIG. 1, and a current flows through a path connecting the resistance interconnection 81 and the U-shaped conductor 61b extending in the stacking direction of the stacked body. The resistance of the resistance interconnection 81 is sufficiently lower than the resistance of the conductor 61b, and the resistance of the entire resistance interconnection 81 is almost negligible with respect to the resistance of the resistance element 5.

Thus, by the embodiment, resistance path length can be gained in the stacking direction of the stacked body, not in a planar way on the substrate surface, and it becomes easy to obtain a desired resistance value while suppressing the increase in the area of the resistance element.

Here, as a comparative example, in a memory device of a stack gate structure in which a floating gate and a control gate are stacked, a resistance element of a peripheral circuit can be formed using polysilicon of the floating gate. The resistance element of this structure has a relatively high resistivity, and can reduce the area of the resistance element easily.

On the other hand, a peripheral circuit transistor in a three-dimensionally stacked memory device is a common CMOS structure. That is, polysilicon that is the gate electrode of the transistor is a single-layer structure, and the upper surface of the gate electrode may have been made into a silicide by cobalt or nickel. Thus, using the gate electrode as a resistance element tends to reduce the resistivity. Accordingly, the area of the resistance element necessary to obtain a certain resistance value tends to be increased, the proportion of the area of the resistance element in the chip area may be increased, and chip size reduction may be inhibited.

To solve this, it may be possible to advance miniaturization in which the width of the resistance element interconnection is reduced, but a fine pattern has the problem that the variation of the resistance value is large due to the problem of the dimensional controllability of the fine pattern. For example, if the resistor is miniaturized easily in order to gain a certain resistance value per unit area, the cross-sectional area of the pattern, which is inversely proportional to the resistivity, is difficult to control and it is difficult to obtain a stable resistance value.

In contrast, in the embodiment, also the resistance element 5 is made a three-dimensional structure similar to the memory string MS; thereby, resistance path length can be gained in the stacking direction of the stacked body, and the controllability for a desired resistance value can be enhanced while the spread of the two-dimensional footprint of the resistance element 5 in the chip is suppressed.

The resistance element 5 of a three-dimensional U-shaped type (plug type) is less susceptible to the dimensional variation in the two-dimensional plane than a resistance element (resistance interconnection) of a two-dimensional planar structure.

Figure 17A:
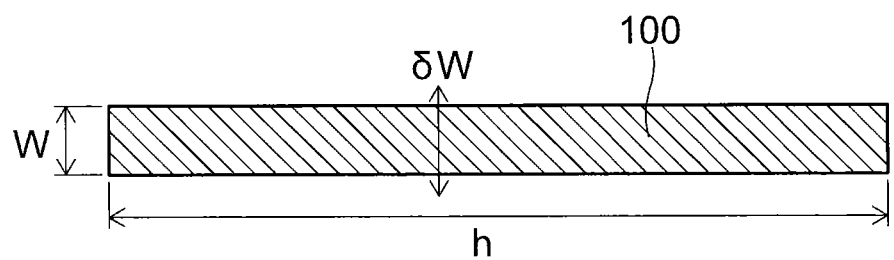
FIG. 17A is a schematic plan view showing a planar shape of a resistance element of a comparative example.
Figure 17B:
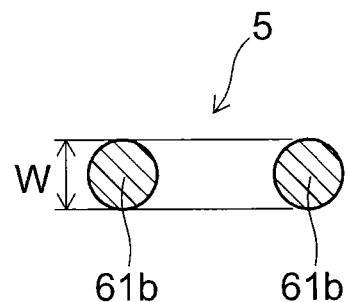
FIG. 17B is a schematic plan view showing a planar shape of the resistance element of the embodiment.

FIG. 17A is a plan view of a resistance element 100 of the comparative example provided in a linear configuration on a two-dimensional plane, and FIG. 17B is a plan view of the resistance element 5 of the embodiment.

When the width of the resistance element 100 is denoted by W and the length is denoted by h, the area of the resistance element 100 is W·h.

When the diameter of the conductor 61b in the resistance element 5 is denoted by W, the area (cross-sectional area) of the conductor 61a is $\pi(W/2)^2$.

The material of the resistance element 100 and the material of the conductor 61b have the same resistivity.

When the amount of variation in W of the resistance element 100 and the conductor 61b is denoted by δW, the difference between the amount of variation in the area of the conductor 61b, $\pi(\delta W/2)^2$, and the amount of variation in the area of the resistance element 100, δW·h, is expressed by Formula (1) below.

$$\pi\left(\frac{\delta W}{2}\right)^2 - \delta W \cdot h = \frac{\pi}{4}\delta W^2 - h \cdot \delta W = \frac{\pi}{4}\delta W\left(\delta W - \frac{4h}{\pi}\right) \quad (1)$$

From Formula (1) above, in the region where the variation amount δW is smaller than 4h/π, the resistance element 5 of the embodiment has a smaller dimensional variation in the two-dimensional plane than the resistance element 100 of the comparative example.

For example, when δW/=approximately 10 nm, the variation amount δW is always smaller than 4h/π in a range of h>7.9 nm. Since the interconnection length h of a two-dimensional resistance is generally several hundred nanometers or more, the resistance element 5 of the embodiment is less susceptible to the dimensional variation in the two-dimensional plane than the resistance element 100 of the comparative example.

Next, a method for manufacturing a semiconductor memory device of the first embodiment is described with reference to FIG. 5A to FIG. 13. FIG. 5A to FIG. 13 show a cross section along the X direction similarly to FIG. 1.

Figure 6A:
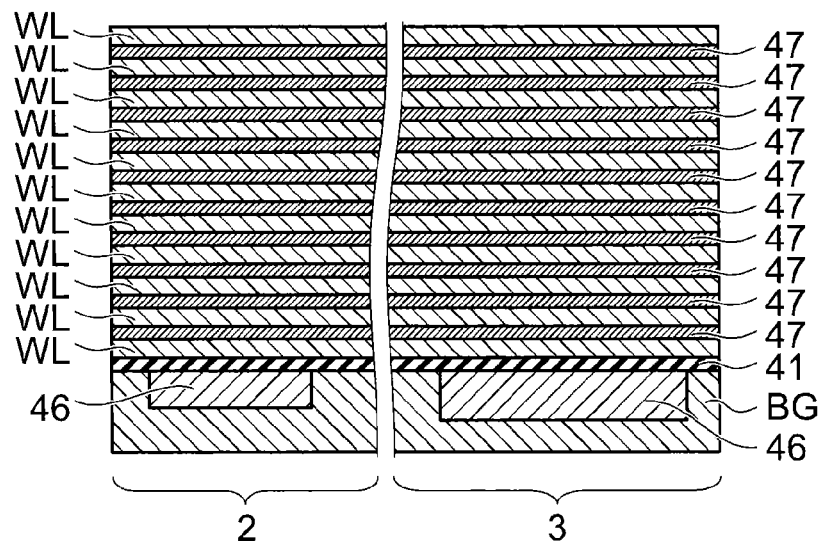

As shown in FIG. 5A, the back gate BG is formed on the substrate 10 via the insulating layer (e.g. silicon oxide) 40. The back gate BG is, for example, a polysilicon film doped with boron (B). In FIG. 6A and the subsequent drawings, the illustration of the substrate 10 and the insulating layer 40 is omitted.

As shown in FIG. 5B, the first trench 51 and the second trench 52 are simultaneously formed in the back gate BG by etching using a resist 91 as a mask. The first trench 51 is formed in the back gate BG in the memory region 2, and the second trench 52 is formed in the back gate BG in the peripheral region 3.

Due to the difference in width between the openings formed in the resist 91, the depth of the second trench 52 is deeper than the depth of the first trench 51, and the width in the X direction of the second trench 52 is larger than the width in the X direction of the first trench 51. Therefore, the volume of the second trench 52 is larger than the volume of the first trench 51.

As shown in FIG. 5C, a sacrifice film 46 is buried in the first trench 51 and in the second trench 52. The sacrifice film 46 is a non-doped silicon film.

The upper surface of the protruding portion of the back gate BG where the trenches 51 and 52 are not formed and the upper surface of the sacrifice film 46 are made flat surfaces flush with each other. As shown in FIG. 6A, the insulating layer 41 is formed on the flat surface.

The conductive layer WL and a non-doped silicon film 47 are alternately stacked in plural on the insulating layer 41. The back gate BG and the stacked body on the back gate BG are formed by, for example, the CVD (chemical vapor deposition) method.

The conductive layer WL is a polysilicon film doped with, for example, boron (B) as an impurity (the first silicon film). The non-doped silicon film 47 as a second silicon film is a silicon film to which an impurity for providing electrical conductivity is not intentionally added, and does not substantially contain impurities other than the elements resulting from the source gas in the film-formation.

The non-doped silicon film 47 is finally replaced with the insulating layer 42 shown in FIG. 1 in a process described later. The non-doped silicon film 47 has a film thickness sufficient to ensure the breakdown voltage between conductive layers WL.

Figure 6B:
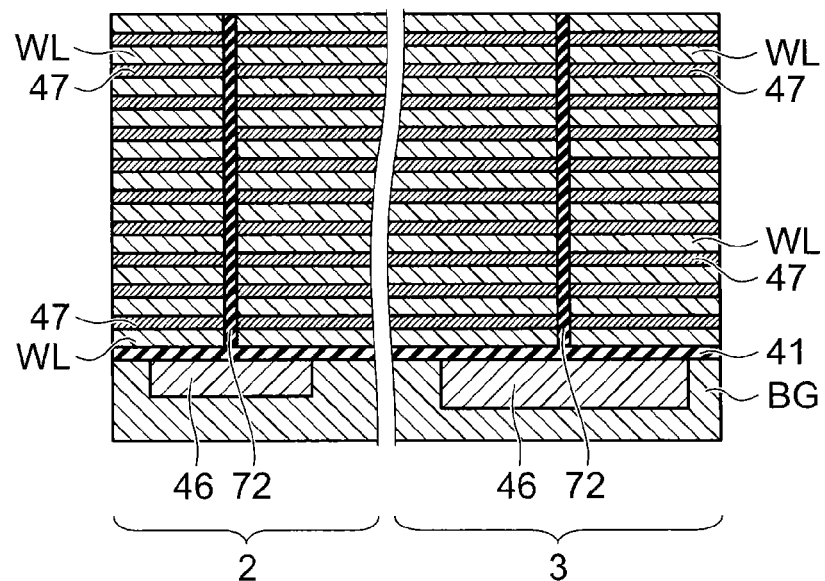

After the stacked body shown in FIG. 6A is formed, photolithography and etching are performed to form a plurality of trenches that divide the stacked body and reach the insulating layer 41, and then the insulating film 72 is buried in the trench as shown in FIG. 6B. The insulating film 72 is, for example, a silicon oxide film or a silicon nitride film.

Figure 7:
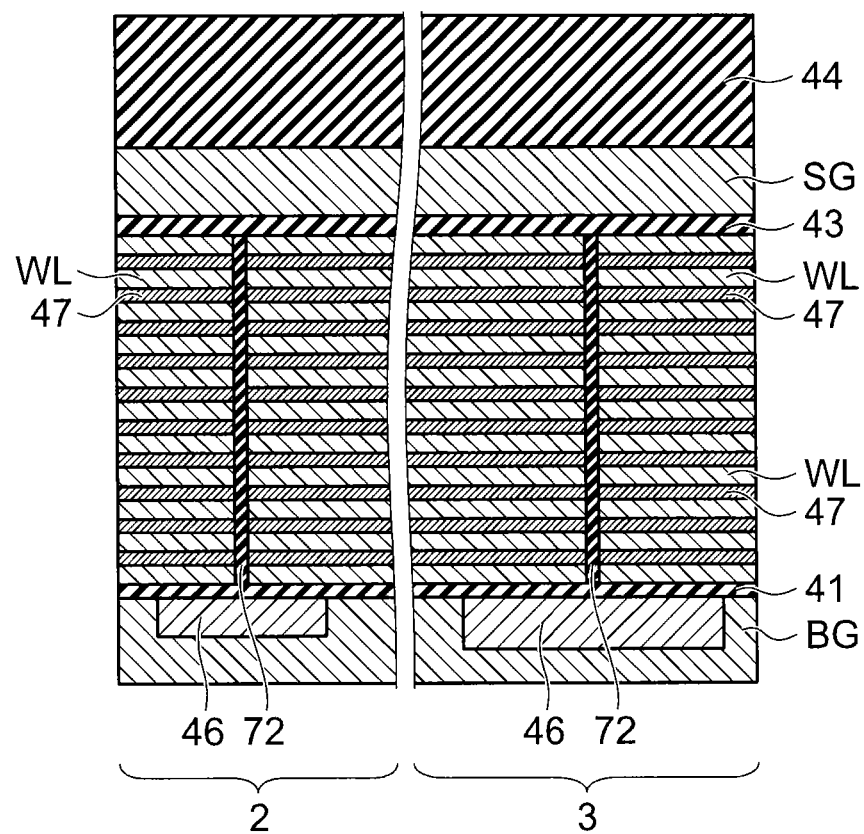

Next, as shown in FIG. 7, the insulating layer 43 is formed on the uppermost conductive layer WL, the select gate SG that forms the drain-side select gate SGD or the source-side select gate SGS is formed on the insulating layer 43, and the insulating layer 44 is formed on the select gate SG.

Figure 8:
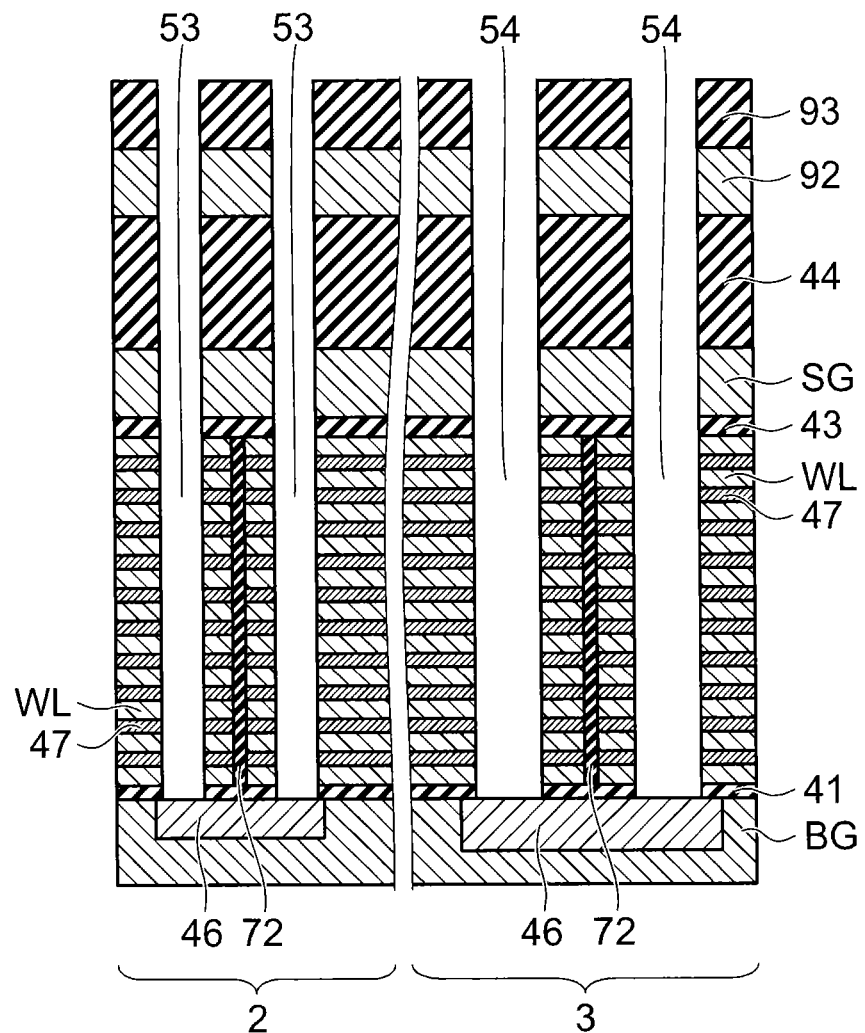

Next, as shown in FIG. 8, a plurality of first holes 53 and a plurality of second holes 54 are formed in the stacked body obtained by the processes mentioned above. The first hole 53 and the second hole 54 are formed simultaneously by, for example, the RIE (reactive ion etching) method using a not-shown mask. Both the first hole 53 and the second hole 54 are circular holes, and the hole diameter of the second hole 54 is larger than the hole diameter of the first hole 53.

Since all the components of the stacked body that includes the plurality of conductive layers WL between the insulating layer 41 and the insulating layer 43 and in which memory cells will be formed are silicon films, the setting of the conditions of RIE and the shape control of the holes 53 and 54 are easy.

The first hole 53 is formed in the memory region 2. The bottom of the first hole 53 reaches the sacrifice film 46 in the memory region 2, and the sacrifice film 46 is exposed at the bottom of the first hole 53. On one sacrifice film 46, a pair of first holes 53 are formed so as to sandwich the insulating film 72. The conductive layer WL and the non-doped silicon film 47 are exposed at the side wall of the first hole 53.

The second hole 54 is formed in the peripheral region 3. The bottom of the second hole 54 reaches the sacrifice film 46 in the peripheral region 3, and the sacrifice film 46 is exposed at the bottom of the second hole 54. The conductive layer WL and the non-doped silicon film 47 are exposed at the side wall of the second hole 54.

After the first hole 53 and the second hole 54 are formed, the sacrifice film 46 and the non-doped silicon film 47 are removed by, for example, wet etching. As the etchant at this time, for example, an alkaline chemical liquid such as a KOH (potassium hydroxide) solution is used.

The etching rate of the silicon film to the alkaline chemical liquid depends on the concentration of the impurity doped in the silicon film. For example, when the concentration of boron as the impurity becomes $1\times10^{20}$ (cm$^{-3}$) or more, the etching rate decreases rapidly to become a few percent of that when the boron concentration is $1\times10^{19}$ (cm$^{-3}$) or less.

In the embodiment, the boron concentration of the back gate BG, the conductive layer WL, and the select gate SG is $1\times10^{21}$ (cm$^{-3}$) to $2\times10^{21}$ (cm$^{-3}$). In the wet etching using an alkaline chemical liquid, the etching selection ratio of the silicon film with a boron concentration of $1\times10^{21}$ (cm$^{-3}$) to $2\times10^{21}$ (cm$^{-3}$) to the non-doped silicon film is 1/1000 to 1/100.

Figure 9:
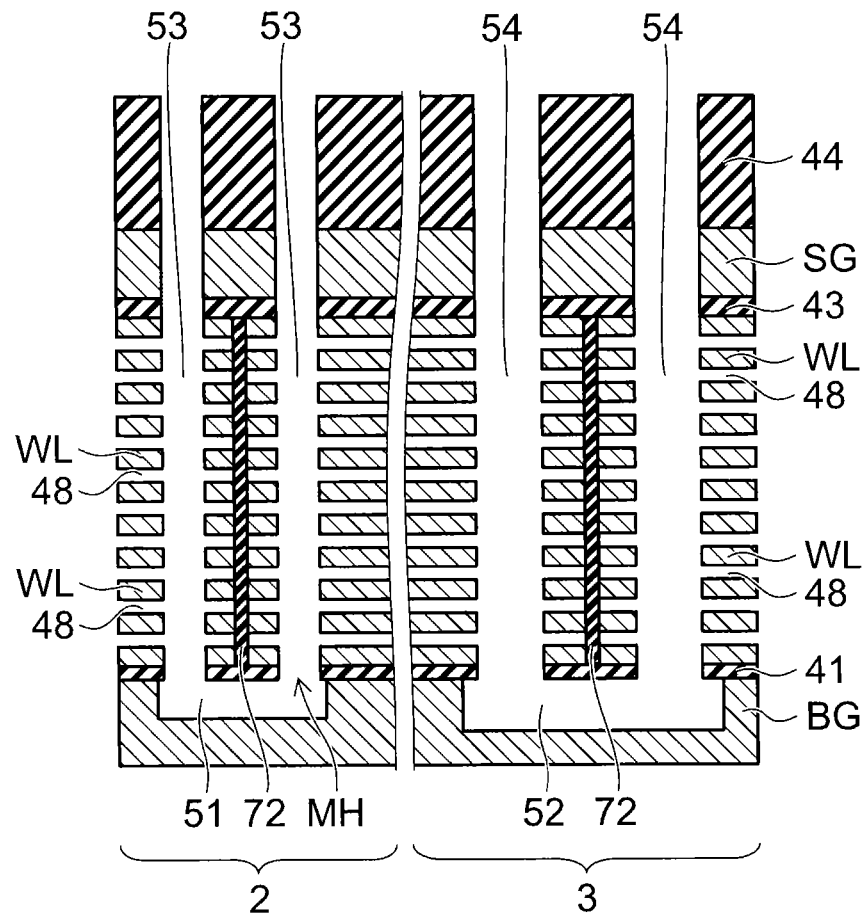
Figure 10:
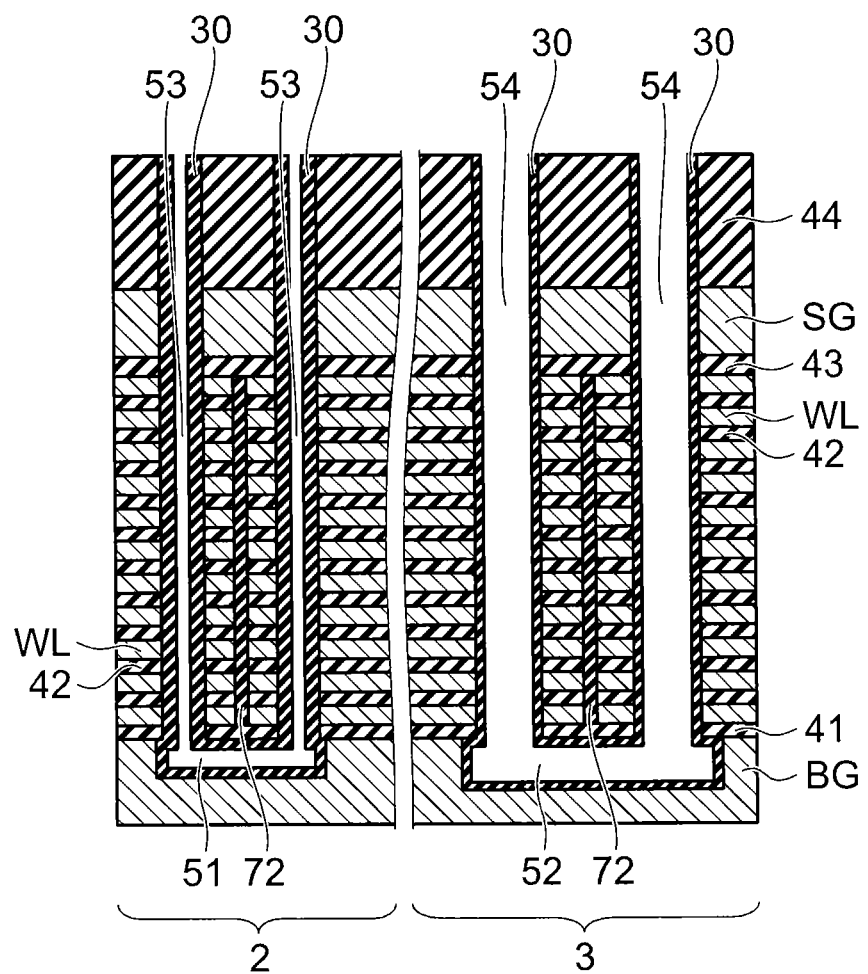

Therefore, by the wet etching mentioned above, the non-doped silicon film 47 and the sacrifice film 46, which is likewise a non-doped silicon film, are removed via the first hole 53 and the second hole 54 as shown in FIG. 9. On the other hand, the back gate BG, the conductive layer WL, and the select gate SG, which are silicon films doped with boron as an impurity, are left.

By the removal of the sacrifice film 46, the first trench 51 and the second trench 52 appear which have been formed in the back gate BG in the previous process. In the memory region 2, the bottoms of a pair of first holes 53 are connected to one common first trench 51 to form one U-shaped memory hole MH. In the peripheral region 3, the bottoms of a pair of second holes 54 are connected to one common second trench 52 to form one U-shaped hole used for the resistance element.

In the memory region 2 and the peripheral region 3, by the removal of the non-doped silicon film 47, a space 48 is formed between conductive layers WL. In the memory region 2, the space 48 leads to the first hole 53. In the peripheral region 3, the space 48 leads to the second hole 54.

The layers left on the back gate BG are supported by the insulating film 72, and the state where the plurality of conductive layers WL are stacked via the space 48 is maintained.

After the wet etching mentioned above, as shown in FIG. 10, the memory film 30 is formed on the side wall of the first hole 53 and the inner wall of the first trench 51, and the insulating layer 42 is formed in the space 48 between conductive layers WL.

As described above with reference to FIG. 3, the memory film 30 includes the block film 31, the charge storage film 32, and the tunnel film 33 stacked in this order from the side of the side wall of the first hole 53. The insulating layer 42 is formed in the space 48 simultaneously with the formation of the memory film 30 on the side wall of the first hole 53. Thus, the insulating layer 42 includes at least the block film 31, which is part of the memory film 30.

Depending on the height of the space 48 and the film thickness of each film included in the memory film 30, the space 48 may be filled up with only the block film 31; or a stacked film including the block film 31 and the charge storage film 32 or a stacked film including the block film 31, the charge storage film 32, and the tunnel film 33 may be buried as the insulating layer 42 in the space 48.

Simultaneously with the formation of the memory film 30 in the first hole 53 and in the first trench 51 in the memory region 2, the memory film 30 is formed as an insulating film also in the second hole 54 and in the second trench 52 in the peripheral region 3. At least part of the memory film 30 is buried as the insulating layer 42 also in the space 48 between conductive layers WL in the peripheral region 3.

Figure 11:
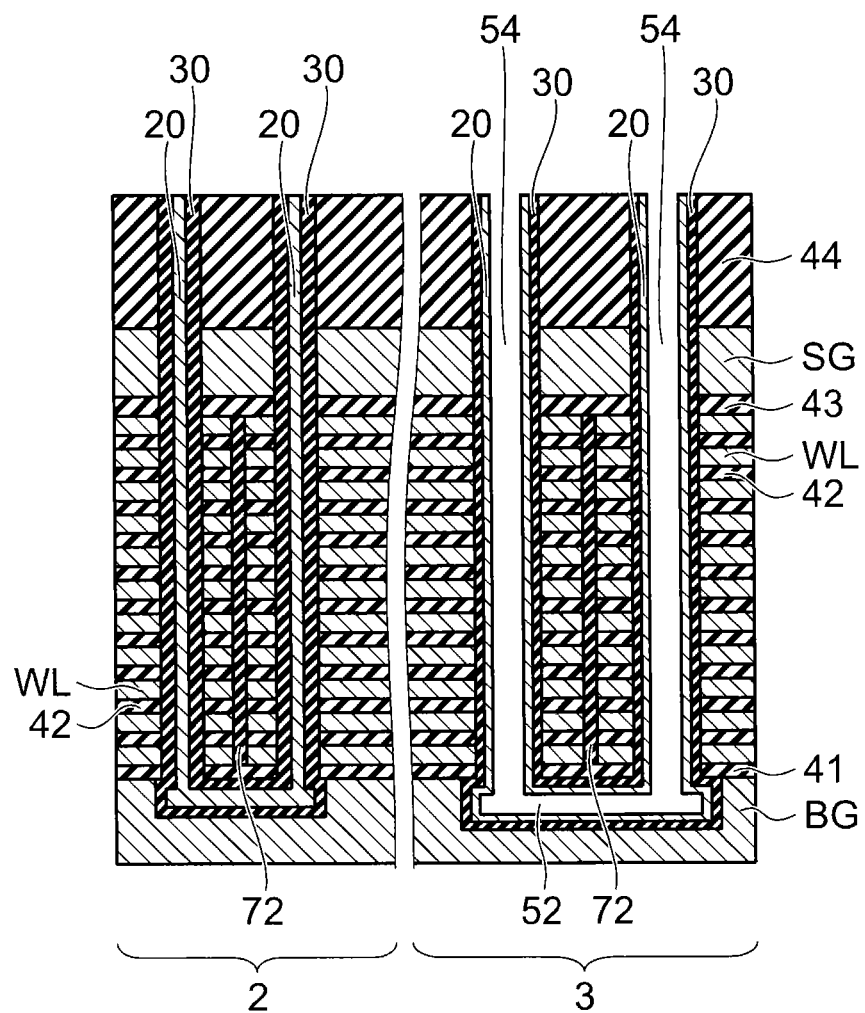

Next, as shown in FIG. 11, the channel body 20 that is a non-doped silicon film is formed on the inside of the memory film 30 in the first hole 53 and in the first trench 51 in the memory region 2. At the same time as this, the channel body 20 is formed also on the inside of the memory film 30 in the second hole 54 and in the second trench 52 in the peripheral region 3.

The interior of the first hole 53 and the interior of the first trench 51 are not filled up with the channel body 20 as shown in FIG. 3, and a space (hollow) is formed on the central axis side of the hole. Also the interior of the second hole 54 and the interior of the second trench 52 are not filled up with the channel body 20, and a space (hollow) is formed on the central axis side of the hole.

The second hole 54 has a larger hole diameter than the first hole 53, and the second trench 52 has a larger volume than the first trench 51. Therefore, the width and volume of the space formed on the inside of the channel body 20 in the U-shaped hole in the peripheral region 3 are larger than the width and volume of the space formed on the inside of the channel body 20 in the memory hole MH in the memory region 2.

Alternatively, the interior of the memory hole MH in the memory region 2 may be filled up with the channel body 20 with no space. Also in this case, the interior of the second hole 54 and the interior of the second trench 52 in the peripheral region 3 are not filled up with the channel body 20, and a space is formed on the inside of the channel body 20.

After the channel body 20 is formed, etchback is performed to remove the upper portion of the channel body 20 in the first hole 53 in the memory region 2. During the etchback, the channel body 20 in the second hole 54 and in the second trench 52 in the peripheral region 3 is removed.

As described above, a space is formed on the inside of the channel body 20 in the second hole 54 and in the second trench 52. Therefore, the etching gas surely goes into a deep position, further into the second trench 52, via the space on the inside of the second hole 54. Thereby, the channel body 20 in the second hole 54 and in the second trench 52 can be removed. Therefore, a conductor (resistor) suitable for the resistance element can be buried in the second hole 54 and in the second trench 52.

During the etching of the channel body 20 in the second hole 54 and in the second trench 52, also part of the memory film 30 with the stacked structure described above formed in the second hole 54 and in the second trench 52 may be removed. Also in this case, an insulating film is still formed on the side wall of the second hole 54 and the inner wall of the second trench 52. Thus, in the resistance element 5, a current flows through the path of the U-shaped conductor 61b, and a current does not flow through the conductive layer WL in the peripheral region 3.

Figure 12:
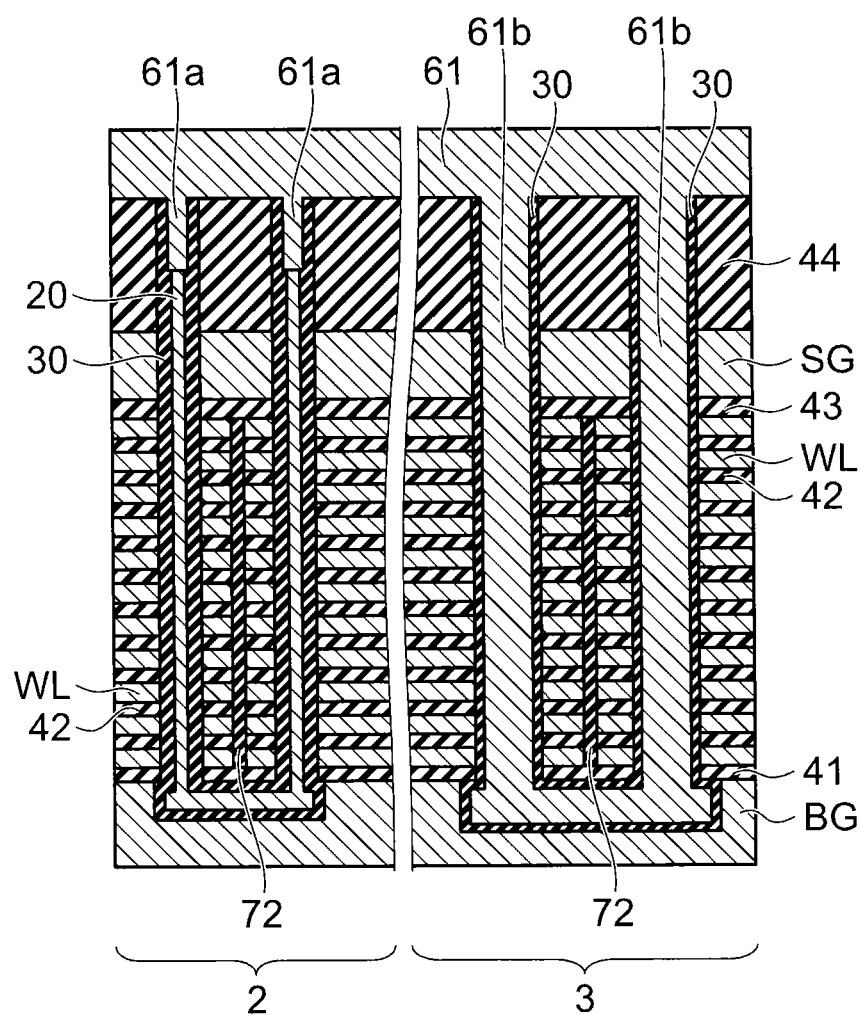

Next, as shown in FIG. 12, a polysilicon film 61 doped with, for example, phosphorus (P) is deposited as a conductor on the entire surface of the stacked body.

A part of the silicon film 61 is buried as the conductor 61a in a portion of the memory region 2 where the channel body 20 is removed. Another part of the silicon film 61 is buried as the conductor 61b in the U-shaped hole in the peripheral region 3.

Alternatively, after the etchback mentioned above, the channel body 20 may remain in the second hole 54 and in the second trench 52 in the peripheral region 3. Also in this case, a space is formed on the inside of the channel body 20 in the second hole 54 and in the second trench 52, and the conductor 61b suitable for the resistance element can be buried in the space.

Figure 13:
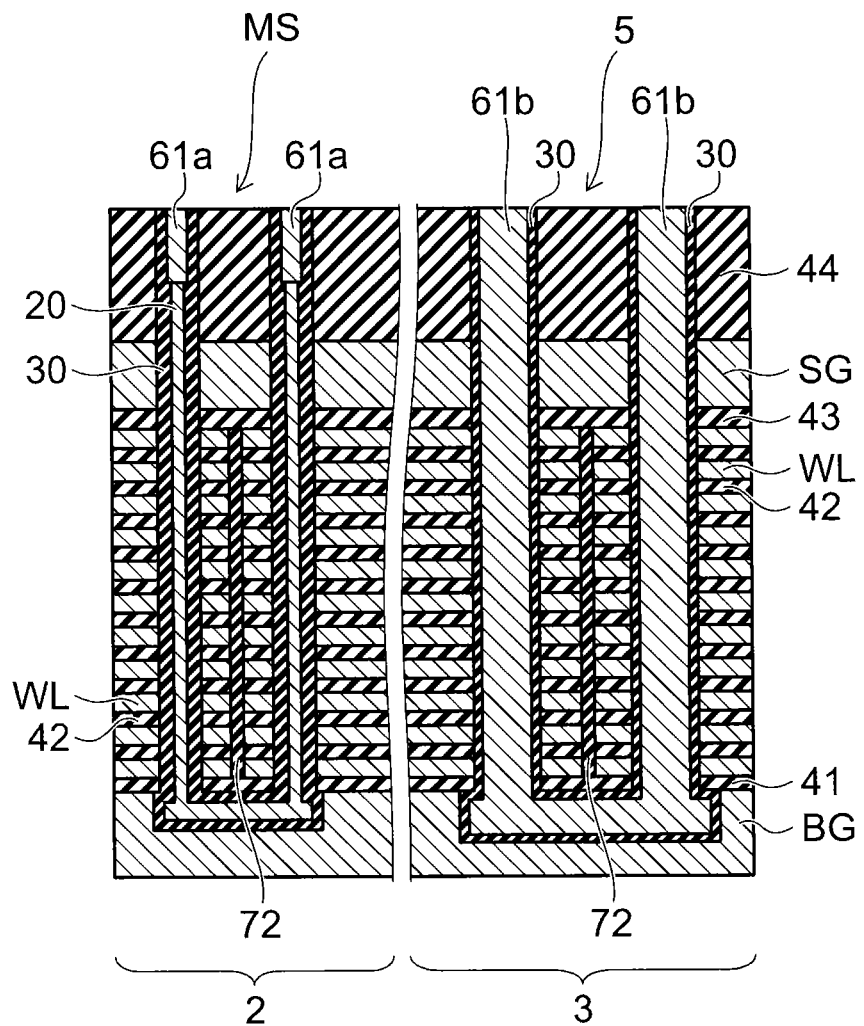

After that, the silicon film 61 on the insulating layer 44 is removed as shown in FIG. 13. The channel body 20 in the memory region 2 is connected to the bit line BL or the source line SL shown in FIG. 2 via the conductor 61a, and functions as the channel of the memory cell. The upper end of the conductor 61b in the peripheral region 3 is connected to the resistance interconnection 81 shown in FIG. 4 via a not-shown contact, and the conductor 61b functions as the resistance element.

In the embodiment, the conductor 61a serving for the connection with the upper interconnection (the bit line BL and the source line SL) in the memory string MS and the conductor (resistor) 61b of the resistance element 5 are formed in the same process using the same material; thus, cost reduction by reducing the number of processes can be achieved.

Second Embodiment

Figure 14:
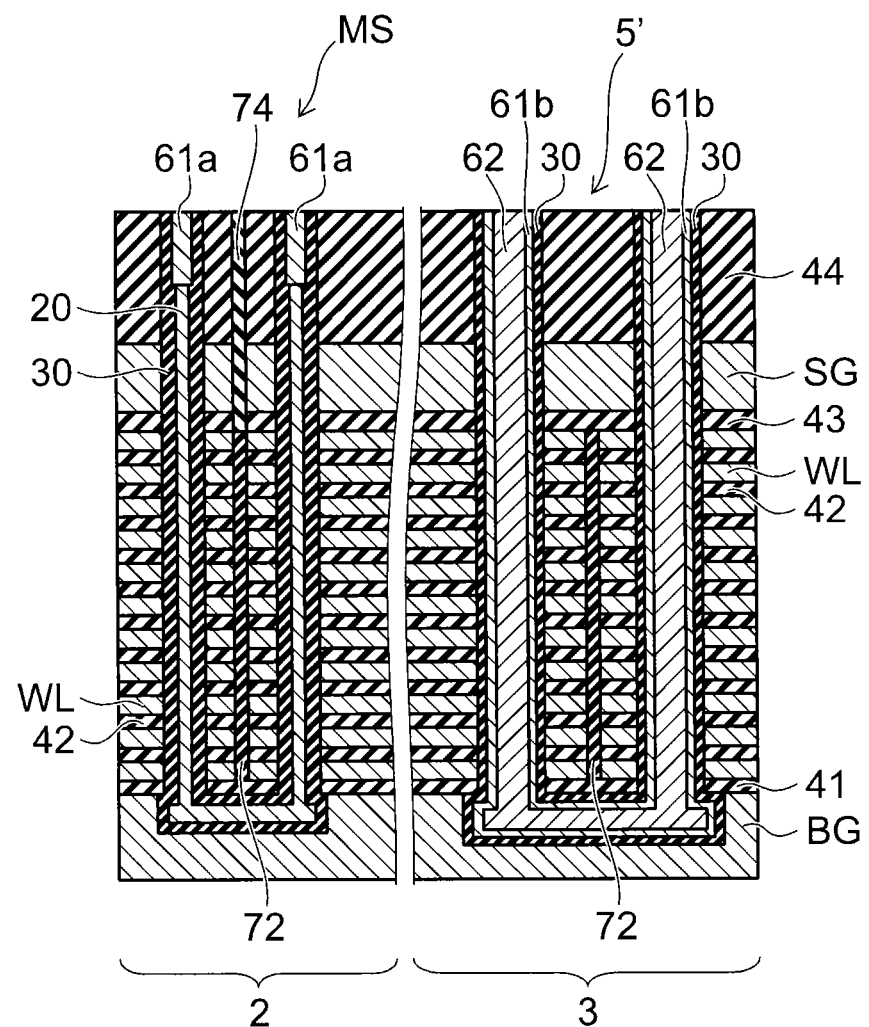
FIG. 14 is a schmatic cross-sectional view of a semiconductor memory device of a second embodiment.

FIG. 14 is a schematic cross-sectional view of a semiconductor memory device of a second embodiment.

Also the semiconductor memory device of the second embodiment includes the memory string MS of a three-dimensional structure and a resistance element 5' provided on the same substrate, similarly to the first embodiment.

In the resistance element 5' in the second embodiment, the film buried in the U-shaped hole (the second hole 54 and the second trench 52) is different from that of the resistance element 5 of the first embodiment.

That is, in the resistance element 5', a conductor 62 different from the conductor 61b is buried on the inside of the insulating film (memory film) 30 via the conductor 61b.

The conductor 62 is, for example, a polysilicon film doped with boron (B), and has a higher resistivity than the conductor 61b, which is a polysilicon film doped with phosphorus (P). Alternatively, as the conductor 62, a metal (e.g. tungsten) having a lower resistivity than the conductor 61b may be buried.

Thus, by adjusting the conductor (resistance material) buried in the U-shaped hole in the resistance element, resistance values in a wider range can be obtained.

Figure 15:
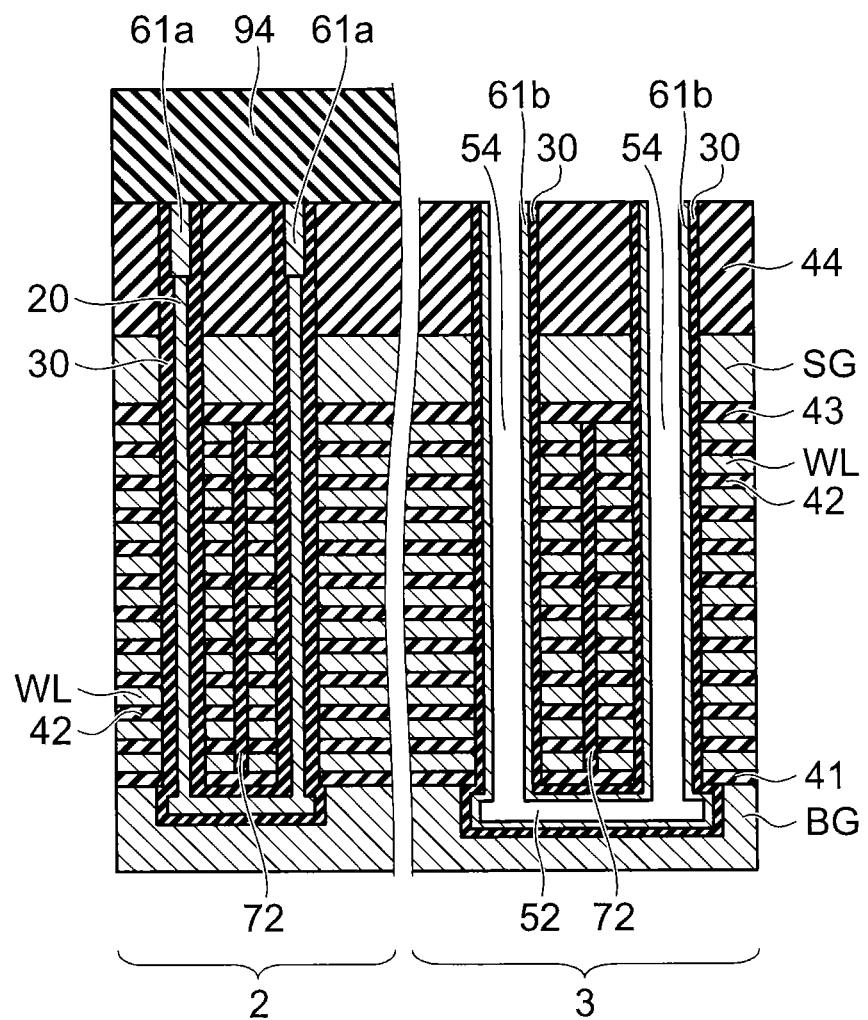
FIG. 15 is a schematic cross-sectional view showing a method for manufacturing the semiconductor memory device of the second embodiment.

When forming the structure of FIG. 14, after the process shown in FIG. 13 described above, as shown in FIG. 15 a resist 94 is provided on the stacked body in the memory region 2, and the conductor 61b in the second hole 54 and in the second trench 52 in the peripheral region 3 is etched to form a space (hollow) in the U-shaped hole in the peripheral region 3. Then, the conductor 62 with a different resistivity from the conductor 61b is buried in the space.

Figure 16:
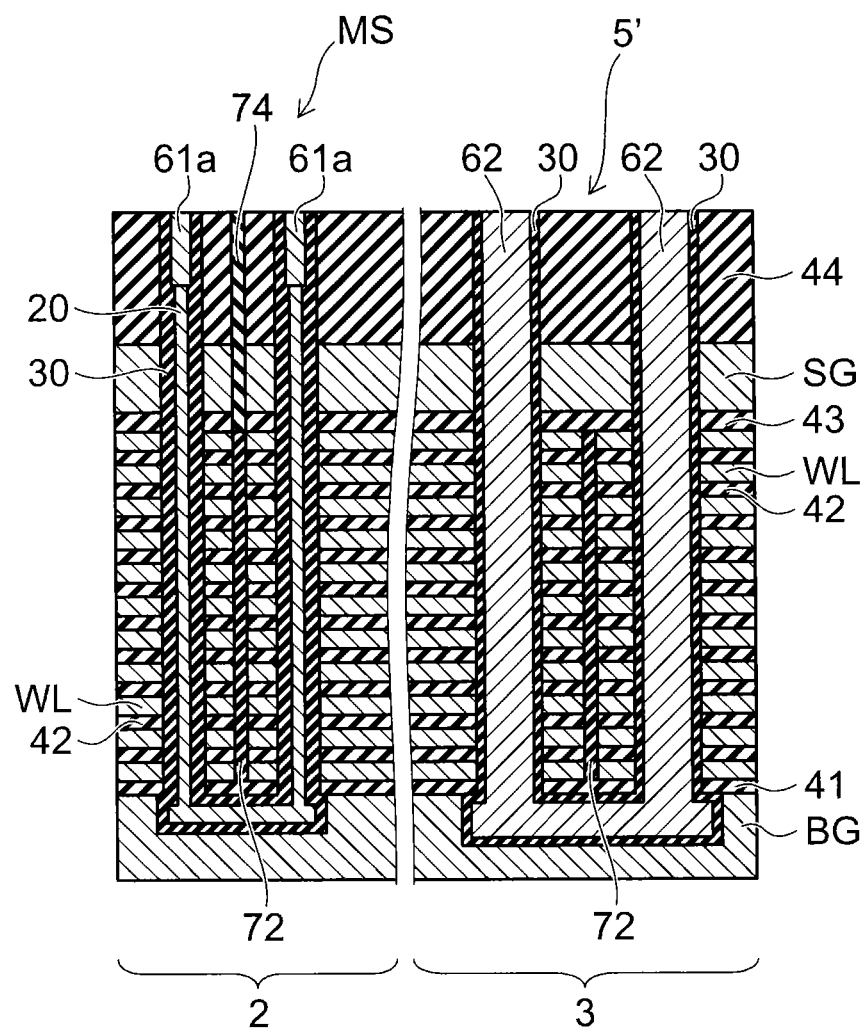
FIG. 16 is a schematic cross-sectional view of a variation of the semiconductor memory device of the second embodiment.

Alternatively, the entire conductor 61b in the second hole 54 and in the second trench 52 in the peripheral region 3 may be removed by etching, and then the conductor 62 may be buried in the U-shaped hole in the peripheral region 3 as shown in FIG. 16.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
    an underlying film including a memory region and a peripheral region, the memory region including a first trench, the peripheral region including a second trench;
    a stacked body including a plurality of conductive layers and a plurality of insulating layers alternately stacked on the underlying film;
    a channel body provided in a pair of first holes and in the first trench, the pair of first holes piercing the stacked body on the memory region to be connected to the first trench;
    a memory film including a charge storage film provided between a side wall of the first hole and the channel body, and between an inner wall of the first trench and the channel body; and
    a conductor provided in a pair of second holes and in the second trench, the pair of second holes piercing the stacked body on the peripheral region to be connected to the second trench and having a hole diameter larger than a hole diameter of the first hole.

2. The device according to claim 1, wherein the conductor has a resistance lower than a resistance of the channel body.

3. The device according to claim 1, wherein
    the channel body is a non-doped silicon film and
    the conductor is a silicon doped with an impurity.

4. The device according to claim 1, wherein the second trench has a volume larger than a volume of the first trench.

5. The device according to claim 1, further comprising an insulating film provided between a side wall of the second hole and the conductor, and between an inner wall of the second trench and the conductor.

6. The device according to claim 5, wherein
    the memory film is a stacked film of a plurality of films and
    the insulating film in the peripheral region includes a same film as a film of at least a part of the memory film.

7. The device according to claim 1, wherein the conductor is a silicon doped with an impurity.

8. The device according to claim 1, wherein the conductor is a metal.

9. The device according to claim 8, wherein the conductor is a tungsten.

10. The device according to claim 1, wherein the conductor is a stacked film of a first conductor and a second conductor, the first conductor and the second conductor having different resistivities.

11. The device according to claim 10, wherein
    the first conductor and the second conductor are a silicon doped with an impurity and
    a type of the impurity is different between the first conductor and the second conductor.

12. The device according to claim 10, wherein one of the first conductor and the second conductor is a silicon doped with an impurity and another is a metal.

13. The device according to claim 12, wherein the metal is a tungsten.

14. The device according to claim 1, wherein the underlying film is a silicon film doped with an impurity.

15. The device according to claim 1, wherein a plurality of the conductor is connected in series via a resistance interconnection provided on the stacked body and connected to an upper end of the conductor.

16. The device according to claim 15, wherein the resistance interconnection has a resistance lower than a resistance of the conductor.

* * * * *